United States Patent [19]

Tompsett

[11] 4,136,335

[45] Jan. 23, 1979

[54] SEMICONDUCTOR CHARGE COUPLED DEVICE ANALOG TO DIGITAL CONVERTER

[75] Inventor: Michael F. Tompsett, New Providence, N.J.

[73] Assignee: Bell Telephone Laboratories, Incorporated, Murray Hill, N.J.

[21] Appl. No.: 788,546

[22] Filed: Apr. 18, 1977

[51] Int. Cl.² ............................................. H03K 13/02
[52] U.S. Cl. ........................ 340/347 AD; 307/221 D; 307/304; 340/347 M; 357/24
[58] Field of Search .................... 340/347 AD, 347 M; 357/24; 307/221 C, 221 D, 304

[56] References Cited

U.S. PATENT DOCUMENTS

| | | | |
|---|---|---|---|
| 3,903,543 | 9/1975 | Smith | 357/24 |
| 3,930,255 | 12/1975 | Means | 340/347 AD |
| 3,958,210 | 5/1976 | Levine | 357/24 X |

Primary Examiner—Thomas J. Sloyan
Attorney, Agent, or Firm—David I. Caplan

[57] ABSTRACT

A semiconductor charge coupled device (CCD) is provided with an array of auxiliary charge storage sites of successively decreasing binary digital storage capacities (½, ¼, ⅛, 1/16, etc.) along the CCD propagation direction. These auxiliary sites sequentially subtract, from a propagating analog signal charge packet, successive amounts of charge ("1") vs. no charge ("0") corresponding to the presence vs. absence of correspondingly sufficient charge in the propagating analog packet. The resulting sequence of "1"'s and "0"'s provides a digital representation in the binary system of the analog signal charge packet.

3 Claims, 14 Drawing Figures

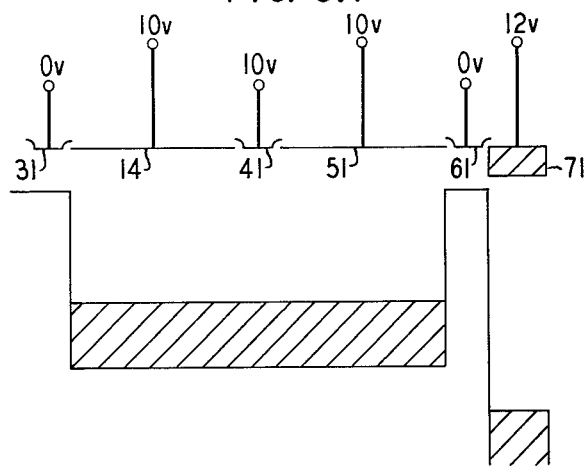
FIG. 3.1
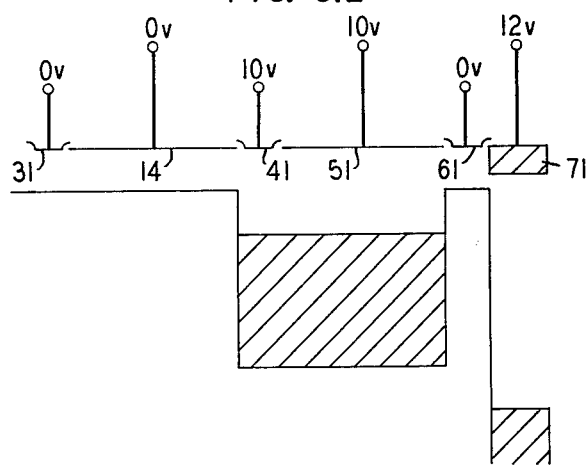
FIG. 3.2
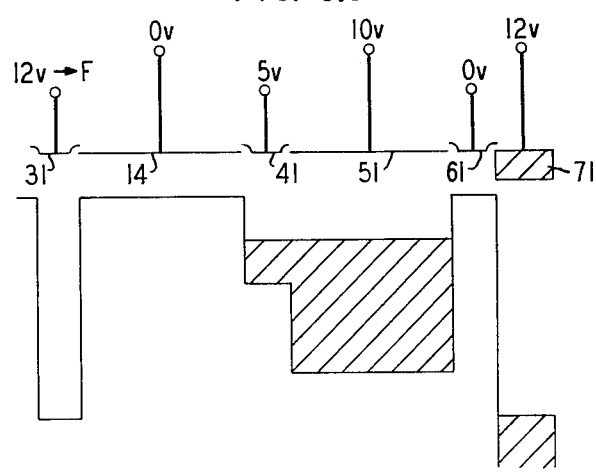
FIG. 3.3

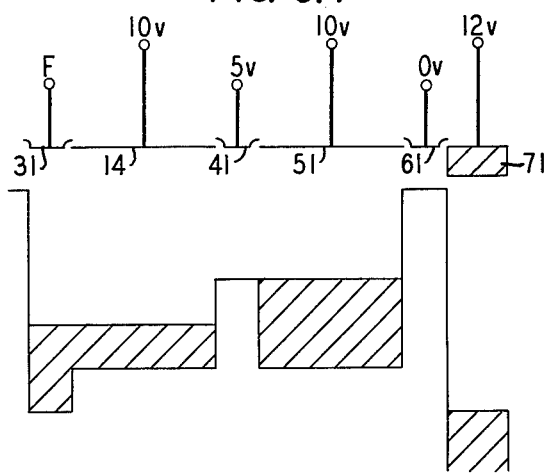
FIG. 3.4
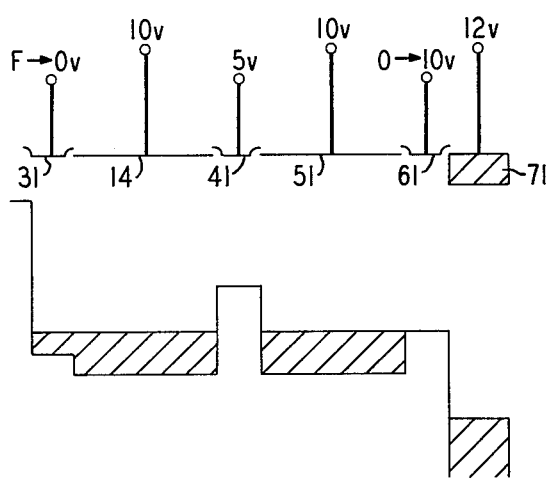
FIG. 3.5
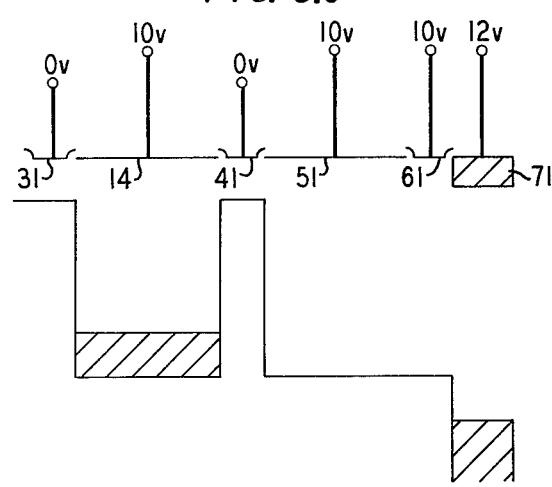
FIG. 3.6

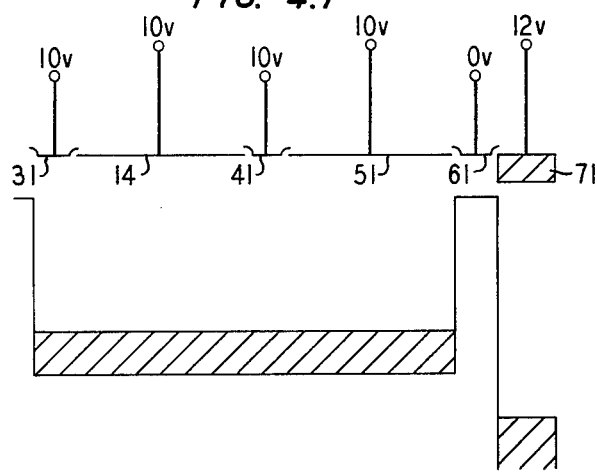
FIG. 4.1
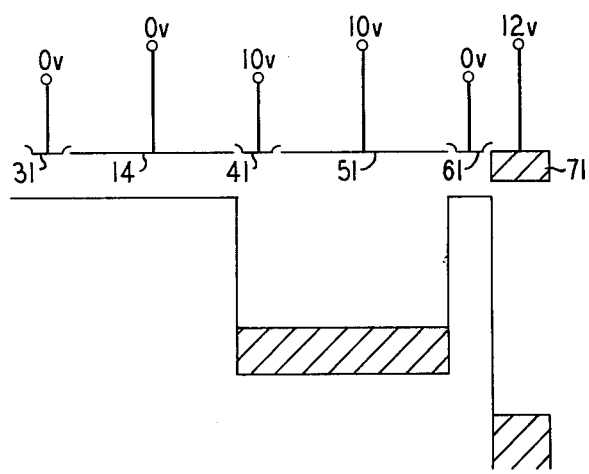
FIG. 4.2
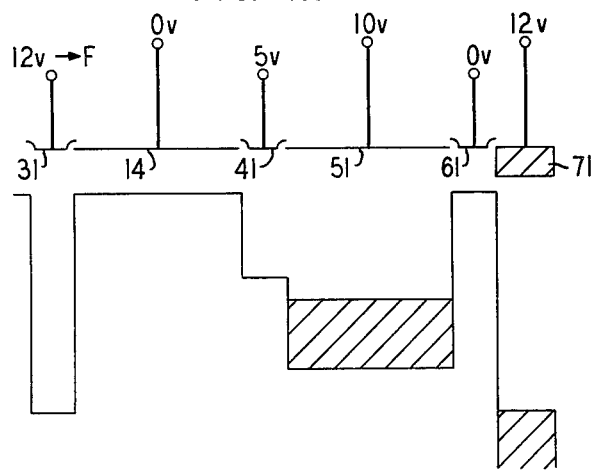
FIG. 4.3

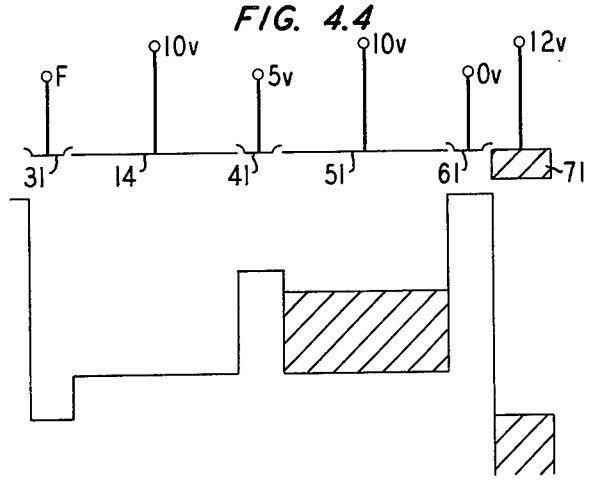
FIG. 4.4
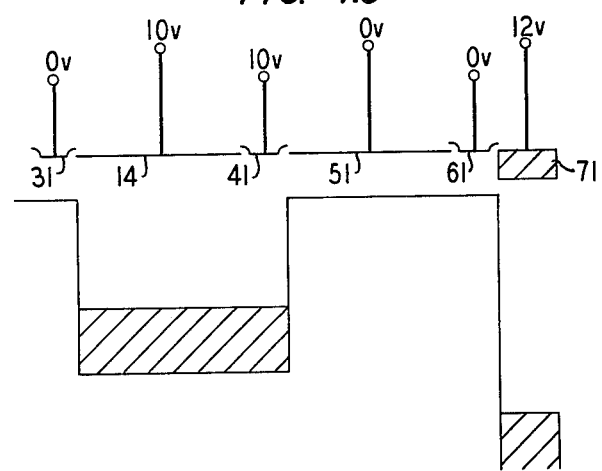
FIG. 4.5
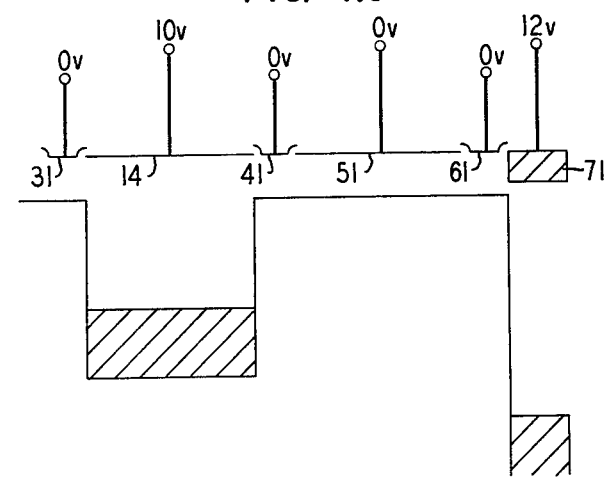
FIG. 4.6

4,136,335

SEMICONDUCTOR CHARGE COUPLED DEVICE ANALOG TO DIGITAL CONVERTER

FIELD OF INVENTION

This invention relates to semiconductor apparatus, and more particularly to semiconductor charge coupled devices for analog to digital conversion.

BACKGROUND OF INVENTION

In telecommunications, it is often desired to convert an analog input signal into a binary digital output signal, in order to perform more economically such signal processing operations as signal amplification or regeneration along the transmission path. However, present-day analog-to-digital (A/D) converters tend to be rather expensive, owing to their hybrid structures with precise required tolerances, that is, precisely manufactured individual elements not in the form of compact integrated circuits.

In U.S. Pat. No. 3,958,210, issued to P. A. Levine on May 18, 1976, an electronic system for analog-to-digital conversion was disclosed including a semiconductor charge coupled device, utilizing the properties of semiconductor surface potential wells for charge storage and transfer in response to voltages applied to electrodes overlying the wells. However, the semiconductor charge coupled device portion of that system produced only a digital counting representation (unitary based number system) of the input analog signal, and the system required complex logic circuitry to convert this digital counting representation into the ultimately desired representation in the binary number system. In other words, an analog input representing the number n was converted by the charge coupled device portion into a "unitary" sequence purely of n "ones" (1,1,1, . . . .1,1,1) according to the unitary number system, rather than directly into the desired binary sequence of "ones" and "zeros" according to the binary number system. Complex logic circuitry was thus required for subsequent conversion of the "unitary" sequence into a corresponding binary digital sequence such as (1,0,1, . . . 0,1,1) representing $n = 1 \times 2^i + 0 \times 2^{i-1} + 1 \times 2^{i-2} + \ldots + 0 \times 2^2 + 1 \times 2^1 + 1 \times 2^0$, where $i$ is selected such that $1 \times 2^i$ is the "most significant bit" in the number n.

Accordingly, it would be desirable to have semiconductor apparatus for converting an analog signal directly into its representation in the binary number system.

SUMMARY OF INVENTION

A semiconductor CCD includes an added auxiliary surface potential well and an added charge sensor for each CCD transfer cell. These auxiliary wells have charge storage capacities in spatial sequence along the CCD propagation direction in the ratio of $1:\frac{1}{2}:\frac{1}{4}:\frac{1}{8}$: etc., and are operated so as to sequentially subtract corresponding amounts of charge from the analog signal charge propagating in the CCD. Each cell has an associated charge sensor having a binary output depending upon whether the charge detected is greater than a predetermined amount or not. Specifically, if and only if the signal charge packet in the n'th CCD cell is detected by the associated charge sensor to be larger than $(\frac{1}{2})^n$ in charge content, then the associated auxiliary well meters out and subtracts a charge equal to $(\frac{1}{2})^n$ from the propagating packet, but otherwise does not subtract any charge. Thereby, the sequence of outcomes of the charge sensors represents the original analog signal charge (prior to any subtractions) in the binary number system.

In a specific embodiment of the invention, a semiconductor CCD is driven by a four-phase clock pulse cycle. A different signal charge packet is injected into an input end of the CCD every clock cycle, in accordance with a different analog signal, each one of which analog signals is to be converted into a binary digital signal representation. Every transfer cell of the CCD has four sites per cell. One of such transfer sites in each cell has a charge storage capacity which is one-half that of the corresponding transfer site of the preceding cell, and every such transfer site is provided with a neighboring associated auxiliary site and a neighboring charge sensor for detecting presence vs. absence of charge therein. The storage capacity of each such auxiliary site is equal to that of the associated transfer site. During operation, as the analog signal charge packet arrives in the transfer site associated with an auxiliary site, charge is shifted to fill the neighboring auxiliary site. If and only if there is any charge then remaining in the transfer site, as detected by the neighboring charge sensor, then the charge in the auxiliary site is delivered to a charge sink and is thus subtracted from the propagating analog charge packet. On the other hand, if there is no charge remaining in the said transfer site, then the charge in the auxiliary site is transferred back to the transfer site for further propagation as an analog packet through the CCD. Thereby, in each transfer cell, charges equal to $\frac{1}{2}$ or 0, $\frac{1}{4}$ or 0, $\frac{1}{8}$ or 0, etc., are sequentially subtracted from the analog charge packet depending upon the presence or absence of a respective corresponding binary bit. Accordingly, the sequence of outcomes, charge ("1") vs. no charge ("0"), of the sensors represents the original analog signal in the binary number system.

BRIEF DESCRIPTION OF THE DRAWINGS

This invention, together with its features, objects, and advantages may be better understood from the following detailed description when read in conjunction with the drawings in which:

FIGS. 3.1 through 3.6 are useful in describing operation of a portion of the apparatus shown in FIG. 1 in the case of detection of a binary "1"; and FIGS. 4.1 through 4.6 are useful in describing operation of said portion of the apparatus shown in FIG. 1 in the case of detection of a binary "0".

DETAILED DESCRIPTION

Figure 1:
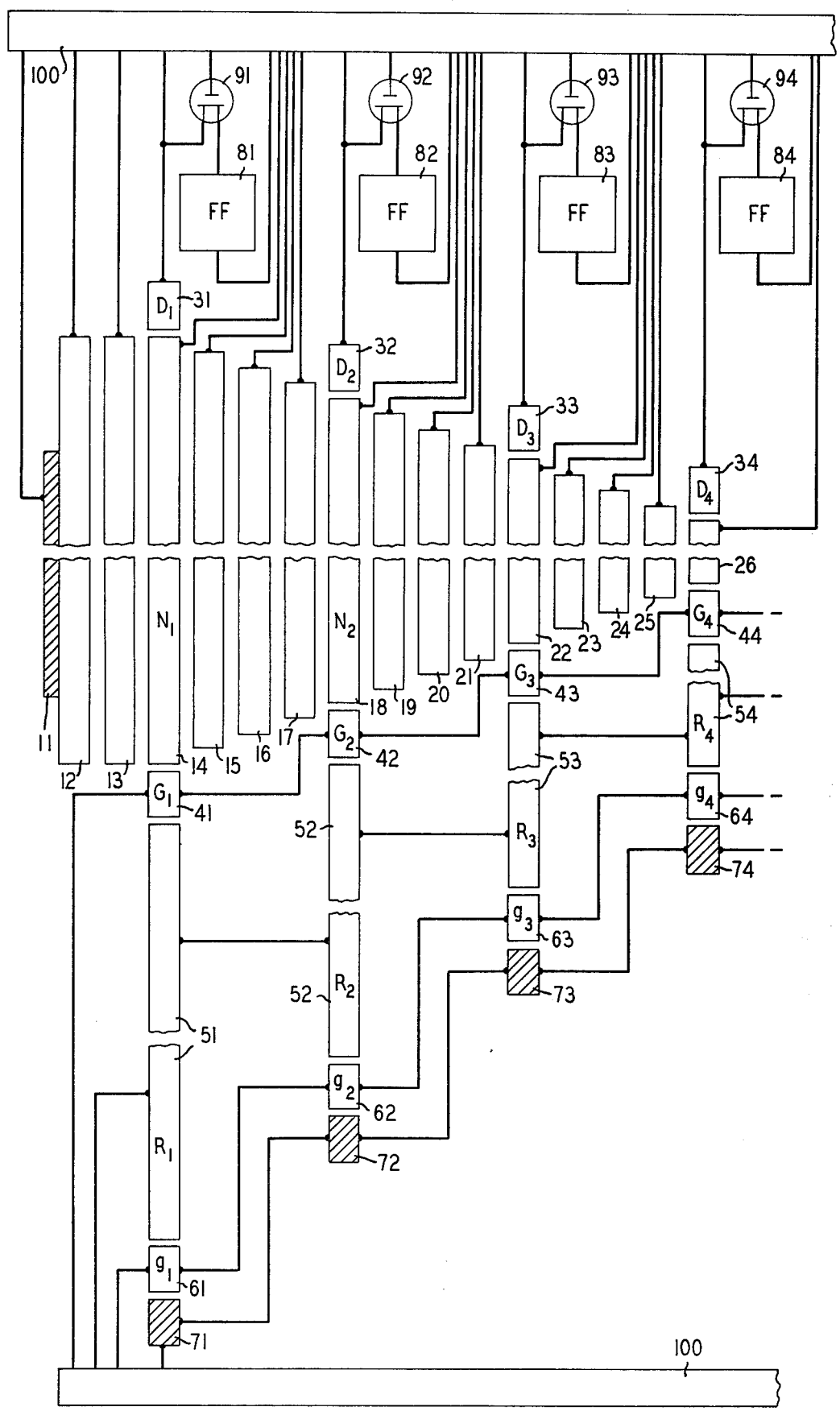
FIG. 1 is a top plan view of a semiconductor CCD analog to digital converter apparatus, in accordance with a specific embodiment of the invention.
Figure 2:
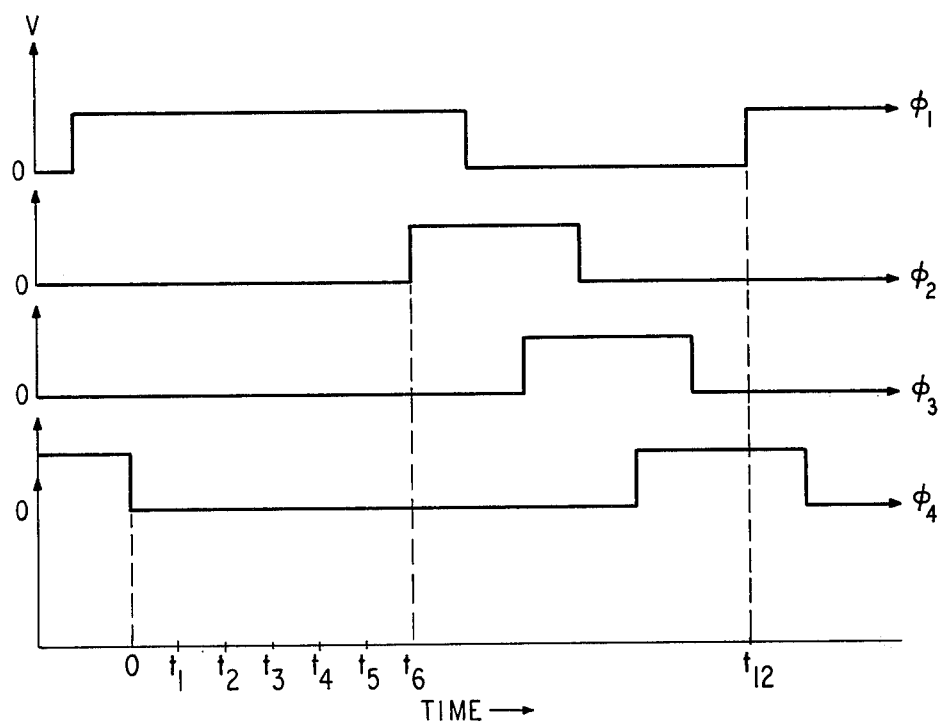
FIG. 2 is a plot of clock voltages vs. time, useful for describing the operation of the CCD of FIG. 1.

A four-phase semiconductor CCD is represented in FIG. 1 by an input diode region 11 together with electrodes 12, 13, 14, . . . 25, 26 . . . As known in the art, each electrode overlaps its next neighboring electrodes and is separated from the top surface of a single crystal semiconductive silicon body by a silicon dioxide layer. Thereby, the voltage applied to each electrode controls the surface potential of each corresponding underlying surface region of the body. Control circuitry 100 provides these applied voltages. In particular, the voltages to electrodes 12 and 13 are applied in accordance with, for example, the potential equilibration method for analog charge input for a CCD, that is, input analog charge packets in accordance with input analog signals. Methods for CCD charge input are described, for example, in the book "Charge Transfer Devices", pages 48–49 (Academic Press, 1975) by C. H. Sequin and M. F. Tompsett. On the other hand, the voltages to electrodes 14, 15, 16, 17, . . . 22, 23, 24, 25, 26 . . . are applied in accordance with a four phase clock pulse cycle ($\phi_1$, $\phi_2$, $\phi_3$, $\phi_4$): voltage phase $\phi_1$ is applied to electrodes 14, 18, 22, 26; $\phi_2$ is applied to electrodes 15, 19, 23; $\phi_3$ is applied to electrodes 16, 20, 24; and $\phi_4$ is applied to electrodes 17, 21, 25. These voltages are as illustrated in FIG. 2 by way of an example only, as known in the art. However, the time interval during which only $\phi_1$ is high ("on") is lengthened somewhat as compared with conventional four-phase operation, as more fully explained below.

Each electrode of the CCD has an associated underlying storage site at the surface of the underlying semiconductor body. There are thus four storage sites per CCD transfer cell in this case of four-phase CCD. As further indicated in FIG. 1, the electrodes 14, 18, 22, 26 . . . are advantageously all of equal widths in the CCD propagation direction but have lengths in the ratio of $1:\frac{1}{2}:\frac{1}{4}:\frac{1}{8}$ . . . Hence the semiconductor storage sites under these electrodes have charge storage capacities likewise in the ratio $1:\frac{1}{2}:\frac{1}{4}:\frac{1}{8}$. . . On either side of, and in overlapping relationship to, the electrode 14 are located electrodes 31 and 41 of minimum dimensions ("minimum geometry"). Typically, the electrodes 31 and 41 are 6 micron by 6 micron, whereas the electrode 14 is 9 micron by 250 micron. An auxiliary electrode 51, of the same dimensions as those of the electrode 14, is located in overlapping relationship to electrode 41. Another electrode 61, of minimum dimensions, is located in overlapping relationship to the auxiliary electrode 51 and to an output diode region 71 serving as a charge sink, as described in greater detail below. The electrode 31, located at the opposite end of the electrode 14 from the electrode 41, is electrically conductively connected by metallization through a switching transistor 91 to a flip-flop detector 81.

Similarly, there are associated with the electrode 18 an auxiliary electrode 52, of the same size as that of the electrode 18, together with electrodes 32, 42, and 62 of minimum dimensions, switching transistor 92 and flip-flop detector 82, and a charge sink 72. As further indicated in FIG. 1, suitable metallization interconnects the electrodes 31 with 32, 41 with 42, 51 with 52, 61 with 62, and the charge sink 71 with 72. Likewise, electrodes 22 and 26 of the CCD have associated electrodes and charge sinks, with electrode 53 of the same size as electrode 22 and electrode 54 of the same size as electrode 26.

During operation, the clock pulses $\phi_1,\phi_2,\phi_3,\phi_4$ are applied to the electrodes of the CCD as indicated in FIG. 2. During the periodic time intervals when $\phi_1$ is high ("on") while $\phi_2,\phi_3,\phi_4$ are all low ("off"), all analog charge packets will be confined to regions underneath electrodes 14, 18, 22, 26 in the case of an N-channel CCD. Each of these packets stems from a different original analog signal to be converted into a binary digital representation. During each of the aforementioned time intervals ($\phi_1$ high; $\phi_2$, $\phi_3$, $\phi_4$ low), charge corresponding to the then most significant bit in the binary system is to be subtracted (or not) from each packet depending upon whether (or not) the packet at that moment contains sufficient charge corresponding to this most significant bit, that is, charge in excess of the storage capacity of the respective neighboring auxiliary electrode, thereby leaving a charge packet for further propagation through the CCD which is modulo the charge capacity of the corresponding auxiliary electrode, hence modulo this most significant bit.

In order to subtract the most significant bit, such a charge subtraction will be presently described (FIGS. 3.1–3.6, 4.1–4.6) in the case of a charge packet under electrode 14, that is, the first subtraction from a given input packet in the CCD in a sequence of successively smaller charge subtractions from what then remains of that packet when it later reaches electrodes 18, 22, 26, respectively. It should be understood that while a charge subtraction from a packet is taking place in conjunction with electrode 14, simultaneously there can be taking place smaller charge subtractions from the remains of other (earlier injected) analog packets in conjunction with electrodes 18, 22, 26; thereby, the speed of analog to digital conversion can be enhanced.

Referring to FIG. 3.1, the situation at time $t_1$ (FIG. 2) in the neighborhood of CCD electrode 14 is depicted, with shaded regions representing charge distribution levels. For the sake of definiteness, as a result of the signal charge of $\frac{3}{4}$ a full well having been metered out by electrodes 12 and 13, the surface potential wells under electrodes 14 and 51 are $\frac{3}{8}$ filled with charge; but the concepts of FIGS. 3.1–3.6 are equally applicable to cases where these wells are at least $\frac{1}{4}$ filled, that is, where the original signal corresponds to at least $\frac{1}{2}$ a full well, otherwise FIGS. 4.1–4.6 apply as described below. The voltages applied to these electrodes 14 and 51, as well as to the minimum geometry electrode 41, are all the same, typically a relatively high voltage of 10 volts. On account of the mutually equal storage capacities of the storage sites under electrodes 14 and 51, the analog charge packet (of original size = $\frac{3}{4}$) is equally apportioned in these two sites, with a negligible amount under the minimum geometry electrode 41. The charge is confined at the two extremes by the relatively low voltage, typically of 0 volt, applied to the electrodes 31 and 61, while the charge is confined at the lateral edges by the then low voltage phases of $\phi_2$ and $\phi_4$ on the CCD electrodes on either side next adjacent to electrode 14. Next, at time $t_2$ as indicated in FIG. 3.2, virtually the entire charge packet is confined under electrode 51 by reason of raising the voltage being applied to electrode 14. Then (FIG. 3.3), the voltage being applied to the minimum geometry electrode 41 is set to a level midway (typically, 5 volts) between the voltage applied to electrodes 14 and 51, while the voltage applied to electrode 31 is raised to a level (typically, 12 volts) somewhat above that of electrode 51.

Immediately thereafter, at time $t_3$, the electrode 31 is allowed to float electrically, for detection of charge to occur during the next step (FIG. 3.4).

As indicated in FIG. 3.4, the voltage applied to electrode 14 is raised (typically to 10 volts) back to its original level (FIG. 3.1). Thereby, all charge in excess of $\frac{1}{2}$ a full well under electrode 51 is transferred to the well under electrode 14, thereby leaving just $\frac{1}{2}$ a full well in the well under electrode 51. At this time, $t_4$, the switch 91 (FIG. 1) is turned "on", so that the flip-flop detector 81 can detect that indeed there is some charge present in the well under electrode 31, that is, that indeed the original analog packet was sufficient to spill charge in excess of $\frac{1}{2}$ a full well from underneath electrode 51. (If not, then the sequence shown in FIGS. 4.1–4.6 should be followed.)

Then (FIGS. 3.5–3.6), at time $t_5$ the voltage applied to electrode 31 is lowered back to its original level of FIG. 3.1 (typically 0 volt) while the voltage applied to electrode 61 is raised to a level (typically, 10 volt) sufficient to allow all charge in the well underneath electrode 51 to spill into the charge sink 71 (typically at 12 volt). In this way the charge remaining in the well under electrode 14 is equal to the original charge packet less ½ a full well, that is, equal to ¼ in the special case under discussion (original charge packet was ¾). This charge is now ready for transfer through the CCD to the electrode 18 where ½ × ½ = ¼ of a full original charge packet will be subtracted (only if there is sufficient signal charge), since the well under electrode 18 is only ½ as large in storage capacity for the same applied voltages as the well under electrode 14. Similarly, whatever charge remains thereafter under electrode 14 is transferred to the well under electrode 22 where ½ × ½ × ½ = ⅛ of a full bucket original charge packet is subtracted (provided there is more than ⅛ of an original full bucket signal charge then remaining). In any event, just prior to transfer into the well under electrodes 14 and 51 of the next succeeding analog signal charge (at time $t_{12}$), the applied voltages are again set as indicated in FIG. 3.1.

In case the signal charge packet metered out by electrodes 12 and 13 is less than ½ a full well, the sequence of FIGS. 4.1–4.6 is applicable. This sequence differs from that of FIGS. 3.1–3.6 in that there is no charge detected in FIG. 4.4 by the flip-flop detector 81. Accordingly, no charge is to be subtracted from the packet to be propagated further along the CCD. Thus, electrode 61 is maintained at its low (typically, 0 volt) setting in FIG. 4.5, as opposed to what was described in conjunction with the counterpart FIG. 3.5. Moreover, in FIG. 4.5 the entire signal charge has been transferred from the well underneath electrode 51 (FIG. 4.4) to the well underneath the CCD electrode 14 (plus a negligible amount under electrode 41) by reason of the applied voltages indicated therein. Then the applied voltage to electrode 41 is lowered, typically to 0 volts, in order to ensure subsequent complete transfer of signal charge along the CCD to electrode 18, etc.

Although the invention has been described in detail with reference to a specific embodiment, various modifications can be made without departing from the scope of the invention. For example, a three-phase, two-phase, or single-phase CCD can be used instead of the four-phase CCD described above in conjunction with a separate auxiliary electrode system (including a charge detector) for each transfer cell, each transfer cell being composed ordinarily of as many transfer sites as there are phases in the clock pulse driving cycle.

What is claimed is:

1. A semiconductor charge coupled device containing a spatial sequence of charge storage cells in a semiconductor body for propagating an analog charge of packets injected in accordance with an analog input signal, each cell containing a selected transfer site, characterized in that in proximity to each selected transfer site is located a different corresponding auxiliary charge storage site plus (a) first means for transferring all analog charge stored at a first predetermined time in the selected site of the main sequence into the corresponding auxiliary site,
    said first means for transferring at a second, later predetermined time from said auxiliary site back to said selected site a first quantity of charge, said first quantity of charge being equal to the excess, if any, in charge content of said analog charge over one-half the storage capacity of said selected site, thereby leaving in said auxiliary site a second quantity of charge equal to said one-half the storage capacity if said analog charge is greater than said one-half the said storage capacity, and said first quantity being equal to zero otherwise, thereby leaving in said auxiliary site all said analog charge, (b) second means for detecting the presence or absence of charge in said selected site at a third predetermined time subsequent to said second predetermined time, thereby generating a binary output signal corresponding to the detection of said presence or absence of charge in said selected site,
    said first means for transferring, in response to the said detection of the presence of charge in said selected site, said second quantity of charge from said auxiliary site into a charge sink, and said first means for transferring, in response to the said detection of the absence of charge in said selected site, all said analog charge from said auxiliary site into said selected site.

2. Semiconductor apparatus for analog to digital conversion comprising:

(a) a main spatial sequence of main charge transfer cells in a semiconductor body for propagating analog charge packets through said sequence, said analog charge packets injected into a first cell of said sequence from an input analog charge packet injection means in accordance with an input analog electrical signal, each cell of said main sequence containing a first plurality of different charge transfer sites, one such site of each such cell being a selected site of that cell;

(b) an auxiliary array of auxiliary charge transfer sites arranged such that the selected site of each cell of the main sequence is located proximate to a different corresponding auxiliary site of the auxiliary array, the charge storage capacity for a given semiconductor surface potential of each such selected site being equal to that of the said corresponding auxiliary site, and each auxiliary site having a charge storage capacity, except for the first auxiliary site in said sequence, for a given surface potential which is equal to one-half that of the auxiliary site located proximate to the selected site of the immediately preceding cell;

(c) binary sensor means for detecting the presence or absence of charge in each selected site of the main sequence;

(d) charge transfer means for transferring all analog charge stored at a first predetermined time in the selected site of the main sequence into the corresponding auxiliary site, said charge transfer means for transferring at a second, later predetermined time from said auxiliary site back to said selected site a first quantity of charge, said first quantity of charge being equal to the excess, if any, of said analog charge over one-half the storage capacity of said selected site, thereby leaving in said auxiliary site a second quantity of charge equal to said one-half the storage capacity if said analog charge is greater than said one-half the said storage capacity, and said first quantity being equal to zero otherwise, thereby leaving in said auxiliary site all said analog charge; and (e) activation means for activating said detector to detect the presence or absence of charge in said selected site at a third predetermined time subsequent to said second predetermined time, thereby generating a binary output signal corresponding to such detection of said presence or absence of charge, in said selected site, said charge transfer means for transferring, in response to the said detection of the presence of charge in said selected site, said second quantity of charge from said auxiliary site into a charge sink, and said charge transfer means for transferring, in response to the said detection of the absence of charge in said selected site, all said analog charge from said auxiliary site into said selected site.

3. Apparatus according to claim 2 in which each transfer site comprises essentially a separate region located at a major surface of a semiconductor body, each said region overlaid by a separate corresponding electrode in insulating relationship to said region, whereby the semiconductor surface potential of each said region is controlled by voltages applied to said corresponding electrode.

* * * * *